United States Patent
Schaefer et al.

(10) Patent No.: US 11,625,170 B2
(45) Date of Patent: *Apr. 11, 2023

(54) ROW HAMMER PROTECTION FOR A MEMORY DEVICE

(71) Applicant: Micron Technology, Inc., Boise, ID (US)

(72) Inventors: Scott E. Schaefer, Boise, ID (US); Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/354,658

(22) Filed: Jun. 22, 2021

(65) Prior Publication Data

US 2021/0311642 A1    Oct. 7, 2021

Related U.S. Application Data

(63) Continuation of application No. 16/546,252, filed on Aug. 20, 2019, now Pat. No. 11,054,995.

(Continued)

(51) Int. Cl.
*G06F 3/06* (2006.01)
(52) U.S. Cl.
CPC .......... *G06F 3/0619* (2013.01); *G06F 3/0629* (2013.01); *G06F 3/0673* (2013.01)
(58) Field of Classification Search
None
See application file for complete search history.

(56) References Cited

U.S. PATENT DOCUMENTS 10,019,350 B1 * 7/2018 Lee ................... G11C 11/4076
2009/0213673 A1   8/2009 Flautner et al.
(Continued)

FOREIGN PATENT DOCUMENTS

KR    20170112786 A    10/2017

OTHER PUBLICATIONS

European Patent Office, "Extended Search Report," issued in connection with European Patent Application No. 19857610.0, dated Nov. 16, 2021 (10 pages).

(Continued)

*Primary Examiner* — Edward J Dudek, Jr.
*Assistant Examiner* — Ralph A Verderamo, III
(74) *Attorney, Agent, or Firm* — Holland & Hart LLP

(57) ABSTRACT

Methods, systems, and devices for row hammer protection for a memory device are described. A memory device may identify a threshold of related row accesses (e.g., access commands or activates to a same row address or a row address space) for a memory array. In a first operation mode, the memory device may execute commands received from a host device on the memory array. The memory device may determine that a metric of the received row access commands satisfies the threshold of related row accesses. The memory device may switch the memory array from the first operation mode to a second operation mode based on satisfying the threshold. The second operation mode may restrict access to at least one row of the memory, while the first mode may be less restrictive. Additionally or alternatively, the memory device may notify the host device that the metric has satisfied the threshold.

20 Claims, 9 Drawing Sheets

Related U.S. Application Data

(60) Provisional application No. 62/728,490, filed on Sep. 7, 2018.

(56) References Cited

U.S. PATENT DOCUMENTS

| | | |
|---|---|---|
| 2014/0177370 A1 | 6/2014 | Halbert et al. |
| 2015/0109871 A1 | 4/2015 | Bains et al. |
| 2016/0180899 A1 | 6/2016 | Kilmer et al. |
| 2016/0211008 A1* | 7/2016 | Benedict ............... G06F 11/076 |
| 2017/0110178 A1* | 4/2017 | Bains ....................... G11C 8/12 |
| 2017/0243632 A1 | 8/2017 | Park et al. |
| 2017/0337958 A1 | 11/2017 | Augustine et al. |
| 2018/0113615 A1 | 4/2018 | Park |
| 2018/0158507 A1 | 6/2018 | Bang |
| 2018/0218767 A1 | 8/2018 | Wolff |
| 2019/0065079 A1* | 2/2019 | Lee ..................... G06F 11/1666 |

OTHER PUBLICATIONS

ISA/KR, International Search Report and Written Opinion of the International Searching Authority, Int'l. Appl. No. PCT/US2019/047616, dated Dec. 6, 2019, Korean Intellectual Property Office, Seo-gu, Daejeon, Republic of Korea, 12 pgs.

* cited by examiner

ROW HAMMER PROTECTION FOR A MEMORY DEVICE

CROSS REFERENCE

The present Application for Patent is a continuation of U.S. patent application Ser. No. 16/546,252 by Schaefer et al., entitled "ROW HAMMER PROTECTION FOR A MEMORY DEVICE," filed Aug. 20, 2019, which claims priority to U.S. Provisional Patent Application No. 62/728,490 by Schaefer et al., entitled "ROW HAMMER PROTECTION FOR A MEMORY DEVICE," filed Sep. 7, 2018, each of which is assigned to the assignee hereof and is expressly incorporated by reference in its entirety.

BACKGROUND

The following relates generally to a system that includes at least one memory device and more specifically to row hammer protection for a memory device.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, Random Access Memory (RAM), Read Only Memory (ROM), Dynamic RAM (DRAM), Static RAM (SRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM and SRAM, may lose their stored state over time unless they are connected to an external power source. Dynamic memory devices, e.g., DRAM, may also use periodic refreshing to maintain the memory cell states.

In some cases, a memory state for some types of memory (e.g., Dynamic Random Access Memory (DRAM)) may be affected in the event of frequent row activations, which may be referred to as row hammering. For example, if a row is accessed repeatedly within a time interval (e.g., a row is hammered), leakage, parasitic currents, or charge pumping caused by the repeated access to one or more rows may cause data corruption in a non-accessed physically proximate (e.g., adjacent) row. As the dimensions for memory decrease, a number of physically proximate rows that may experience data corruption (e.g., a number of victim rows) during row hammering may increase. Improving memory devices, generally, may include increasing memory cell density, increasing read/write speeds, increasing reliability, increasing data retention, reducing power consumption, or reducing manufacturing costs, among other metrics. Further, improving memory device performance (e.g., increased reliability, increased data retention) in the case of row hammering may be desired.

DETAILED DESCRIPTION

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles, in some cases with autonomous or semi-autonomous driving capabilities) may be subject to increased reliability constraints. As such, memory devices (e.g., DRAM) for some applications may be expected to operate with a reliability subject to relatively higher industry specifications (e.g., higher reliability constraints).

Some memory types may lose a stored state or have the stored state change to a different state in the event of frequent row activations, or row hammering. That is, if a single row, group of rows, or pattern of rows are accessed with a relatively high frequency, the memory state for victim rows (e.g., adjacent or proximate rows) may be affected. In some cases (e.g., automotive applications), increased reliability of memory cells may be desired (e.g., for critical safety functions). That is, it may be desirable to prevent dynamic memory cells from changing from a stored state due to row hammering. For example, dynamic memory cells (e.g., DRAM cells) of a memory device may lose their stored data absent periodical refresh of the data, and row hammering may cause dynamic memory cells to lose a stored state or have the stored state change to a different state over less time (e.g., faster than a refresh cycle). In addition, some applications may present different patterns of memory access during normal or predicted use.

Techniques for improved row hammering protection for a memory device are described. For example, the memory device may utilize a threshold corresponding to a maximum metric of related accesses (e.g., access commands or activates to a same row address or a same row address space) of a memory array. In the event that the memory device detects a metric (e.g., number or pattern) of row access commands that satisfies (e.g., is equal to or greater than) the threshold (e.g., the memory device detects a row hammer), the memory device may take an action based on detecting the row hammer. In one example, the memory device may activate a safe mode for the memory array associated with the detected row hammer. The safe mode may prevent row accesses to at least one row of the memory array thus decreasing the chance of further data corruption resulting from frequent row accesses. Additionally or alternatively, the memory device may transmit a notification to a host device indicating the detected row hammer associated with the memory array. Based on the notification, the host device may take mitigation actions to prevent an application from performing additional row accesses related to the row hammering at the memory array.

Figure 1:
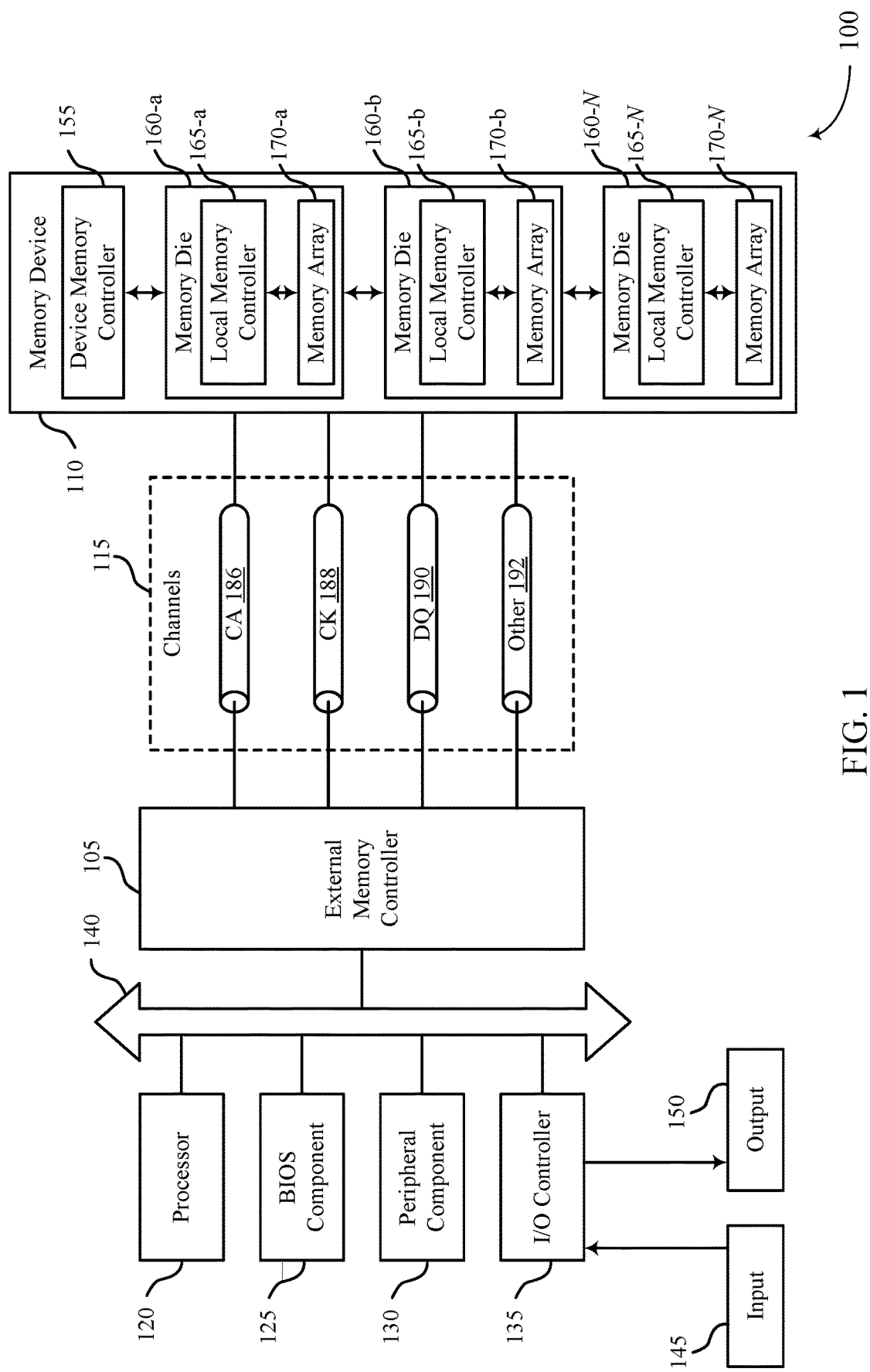
FIG. 1 illustrates an example of a system that supports row hammer protection for a memory device as disclosed herein.
Figure 2:
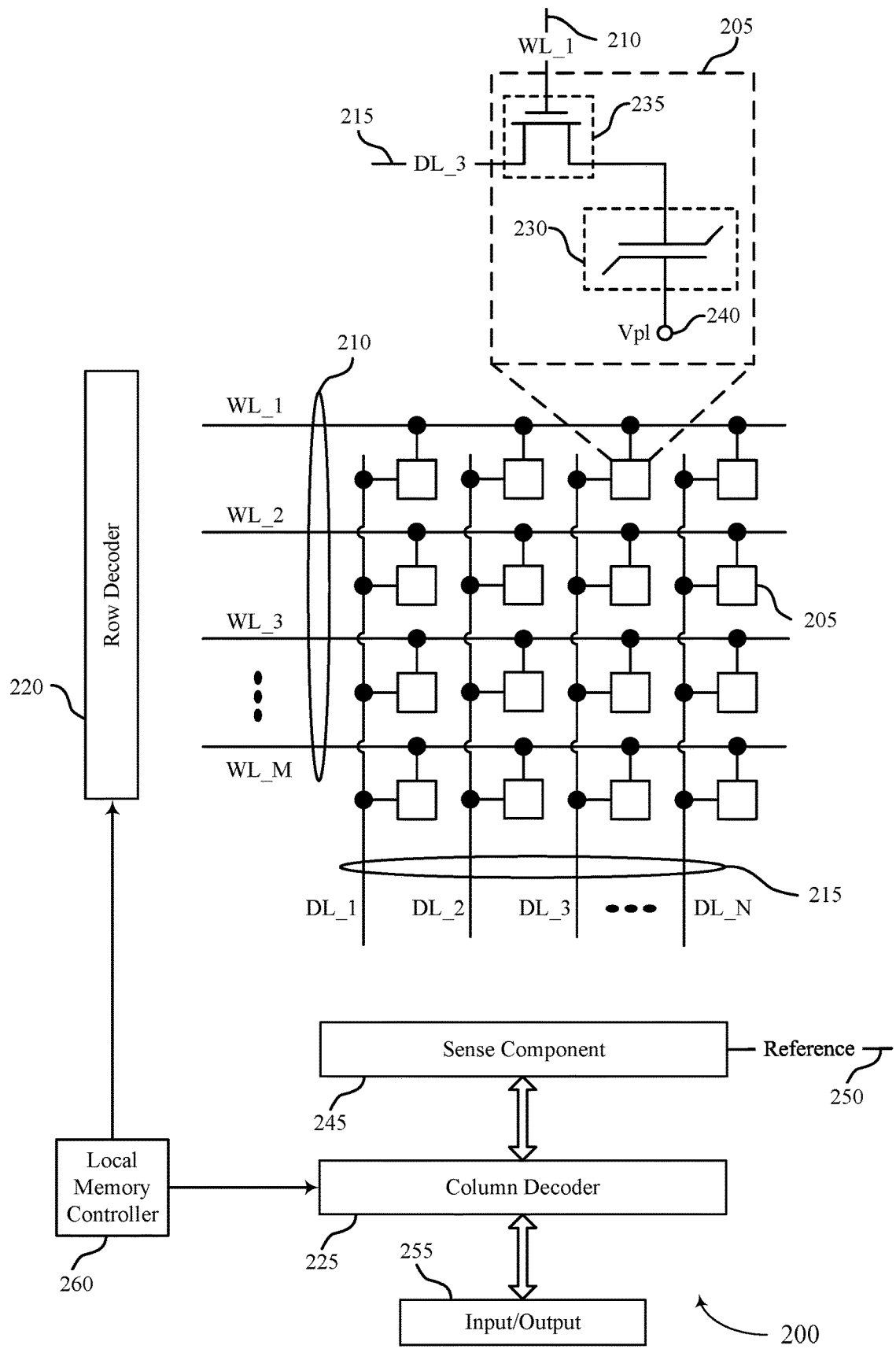
FIG. 2 illustrates an example of a memory die that supports row hammer protection for a memory device as disclosed herein.
Figure 3:
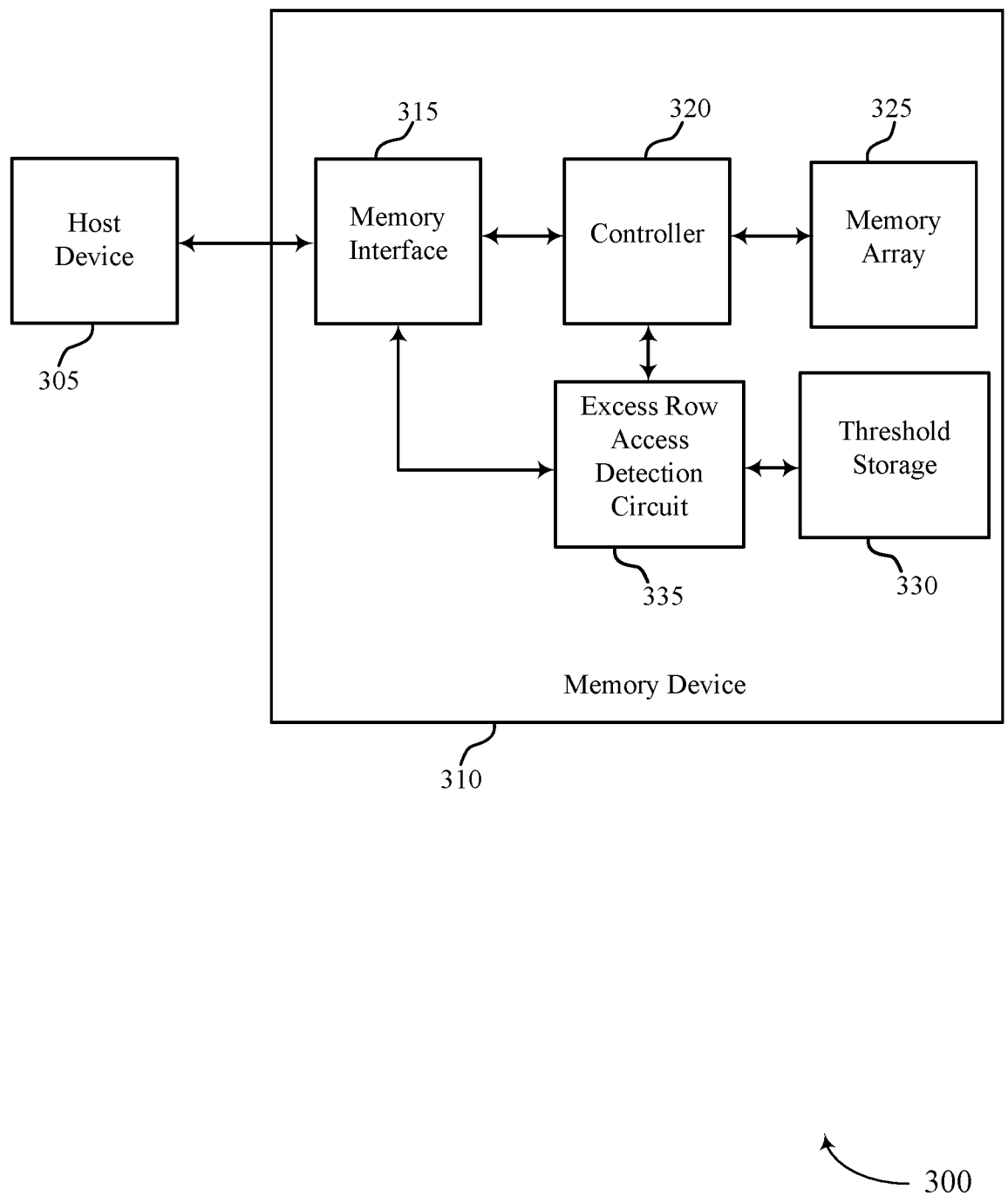
FIG. 3 illustrates an example of a system that supports row hammer protection for a memory device as disclosed herein.

Features of the disclosure are initially described in the context of a memory system and device with reference to FIGS. 1, 2, and 3. Features of the disclosure are described in the context of a process flow with reference to FIGS. 4, 5, and 6. These and other features of the disclosure are further illustrated by and described with reference to apparatus diagrams and flowcharts in FIGS. 7-9 that relate to row hammer protection for a memory device.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. In some cases, the system 100 is an automotive system, such as a vehicle control system, a fleet management system, a location tracking system, a navigation system, an infotainment system, or the like. The system 100 may be an example of a portable electronic device in other cases. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device (e.g., a graphics processing unit (GPU)), a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input 145, or output 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not know the details of the operation of the memory device 110. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any number of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

System 100 may be configured to employ techniques for improved row hammering protection for memory devices 110. The memory device 110 may utilize a threshold corresponding to a maximum metric of related accesses (e.g., access commands or activates to a same row address or a same row address space) of a memory array 170. In the event that the memory device 110 detects a metric (e.g., number or pattern) of row access commands that satisfies the threshold (e.g., the memory device 110 detects a row hammer), the memory device 110 may take an action based on detecting the row hammer. In one example, the memory device 110 may activate a safe mode for the memory array 170 associated with the detected row hammer. The safe mode may prevent row accesses to at least one row of the memory array 170 thus decreasing the chance of further data corruption resulting from frequent row accesses. Additionally or alternatively, the memory device 110 may transmit a notification to a host (e.g., the external memory controller 105) indicating the detected row hammer associated with the memory array 170. The host may take mitigation actions to prevent an application from performing additional row accesses related to the row hammering at the memory array 170.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor 230. DRAM architectures may include a capacitor 230 that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL 3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component 235.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component 245) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor 230 of the target memory cell 205. The local memory controller 260 may perform a re-write operation or a refresh operation to return the memory cell 205 to its original logic state. The local memory controller 260 may re-write the logic state to the target memory cell 205 after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

FIG. 3 illustrates an example of a system 300 that supports techniques for row hammer protection for a memory device. The system 300 may include one or more components described herein with reference to FIGS. 1 and 2. For example, the system 300 may include a host device 305, which may be an example of the external memory controller 105 as described with reference to FIG. 1; a memory device 310, which may be an example of the memory device 110, the memory dice 160, or the memory die 200 as described with reference to FIGS. 1 and 2; a controller 320, which may be an example of the device memory controller 155, one or more local memory controllers 165, or the local memory controller 260 as described with reference to FIGS. 1 and 2, or any combination thereof; a memory array 325, which may be an example of the memory arrays 170 as described with reference to FIG. 1. The memory device 310 may also include threshold storage 330 and an excess row access detection circuit 335.

Host device 305 may send commands to memory device 310, which may be received via memory interface 315. The commands may include individual row access commands (e.g., individual read or write commands), or burst commands (multiple sequential row or column access commands). Controller 320 may receive the commands from the memory interface 315, process the commands, and execute the commands on memory array 325. Controller 320 may operate the memory array 325 according to modes of operation. An access mode, as used herein, may include controller 320 executing commands (e.g., all commands received) from host device 305 to the indicated portion of memory array 325. Memory array 325 may include one or more memory banks, each of which may comprise one or more rows and/or one or more columns. Each command may include an access command that may include an activation (e.g., read, write, etc.) for a row address within memory array 325. Controller 320 may execute multiple access commands (e.g., an access command pattern) on memory array 325, thus accessing a pattern of banks, rows, and/or columns within memory array 325.

The threshold storage 330 may store a threshold associated with access commands or accesses for the memory device 310. The threshold may define a number of related accesses that, when exceeded, may result in data corruption from row hammering. In some cases, the related accesses may correspond to a maximum number of accesses to a same row address or a same row address space (e.g., a group of rows, a bank, etc.). Additionally or alternatively, the related accesses may correspond to a composite number of accesses for one or more patterns of accesses to a row address space. The maximum number of related accesses may be sequential or may occur within a certain time window (e.g., a refresh cycle, a portion of a refresh cycle), certain number of access operations, or some other criteria.

In some cases, memory device 310 may have an associated preconfigured threshold. For example, the threshold storage 330 may store a preconfigured threshold that is fixed by a vendor such as a DRAM vendor. The threshold storage 330 may include, for example, a value for the preconfigured threshold that is hard-wired (e.g., stored in one or more fuses, anti-fuses or otherwise stored in one or more memory elements that are non-volatile and can be preconfigured (e.g., Read Only Memory (ROM) or One-Time-Programmable (OTP) memory).

Memory device 310 may be used to support a variety of applications. In some cases, each application may access the memory array 325 of memory device 310 according to known access patterns. That is, the intended purpose of an application may result in a particular set of access patterns. For example, a general purpose application (e.g., with a wide range of intended purposes) may access memory array 325 according to unpredictable access patterns. Alternatively, a special-purpose application (e.g., with a narrower intended purpose) may access the memory array 325 according to more predictable access patterns, and may have discernable bounds on access commands to related or proximate addresses (e.g., a single row or groups of rows). For special-purpose applications (e.g., an application within an autonomous vehicle), certain access patterns may be determined to be more unlikely than others. For example, a special-purpose application may be unlikely to exhibit access patterns resembling row hammer in its normal operation. It may be desirable for a memory device 310 to utilize a lower threshold for a memory device 310 associated with some applications (e.g., a special-purpose application) when compared with other applications (e.g., a general purpose application). Alternatively, a special-purpose application may be likely to exhibit access patterns resembling row hammer in its normal operation. Here, it may be desirable for the memory device 310 to utilize a higher threshold.

In some cases, different portions (e.g., rows, banks, etc.) of the memory array 325 may be associated with different thresholds. For example, some portions of the memory array 325 may be protected areas where a lower number of accesses are allowed. In one example, some protected areas may have a threshold of a single row access, where any additional row accesses (e.g., within a refresh cycle) will exceed the threshold and cause detection of an excess row access condition. Thus, host device 305 may utilize different portions of memory array 325 for different applications or purposes. For example, portions of memory array 325 associated with a lower threshold may be used for applications that are associated with critical functions that rarely, if ever, result in access patterns consistent with row hammering, while other portions of memory array 325 associated with a higher threshold may be used for general purpose or less critical functions.

In some cases, the preconfigured threshold(s) in threshold storage 330 may be adjustable or overwritable (e.g., as a trim parameter). For example, threshold storage 330 may include OTP memory (e.g., fuses or anti-fuses) for storing the preconfigured threshold, and the host device 305 may program the preconfigured threshold upon initial memory device 310 power-up or configuration (e.g., the first time host device 305 accesses memory device 310). After the programming, the preconfigured threshold may then be fixed for subsequent power cycles.

According to various aspects threshold storage 330 may include a capability of storing a programmed (e.g., not preconfigured) threshold. In some cases, threshold storage 330 may include non-volatile memory (e.g., One-Time-Programmable (OTP) memory, Electronically Erasable Programmable Read-Only Memory (EEPROM), Ferroelectric Random Access Memory (FRAM), Magnetoresistive Random Access Memory (RAM)) for storing a programmed threshold. Alternatively, threshold storage 330 may include volatile memory (e.g., DRAM, Static Random Access Memory (SRAM), registers) for storing a programmed threshold. Host device 305 may program threshold storage 330 to store a programmed threshold (e.g., upon initialization or configuration). The programmed threshold may be based on an application of memory device 310. That is, although the preconfigured threshold may represent a number of related accesses associated with decreased data retention, certain applications (e.g., special-purpose applications) may utilize a different (e.g., lower) threshold. For example, the preconfigured threshold of memory device 310 may be 10,000. However, memory device 310 may be associated with an autonomous vehicle application that may be unlikely to exhibit row hammer-like accesses. Therefore, host device 305 may program threshold storage 330 (via controller 320 or memory interface 315) to store a programmed threshold less than 10,000. In some cases, host device 305 may program threshold storage 330 to store a programmable threshold by programing a mode register within memory device 310. In some cases, host device 305 may program threshold storage 330 to store a programmable threshold greater than the preconfigured threshold, but excess row access detection circuit 335 may be configured to treat the lower of the two thresholds as operative.

Threshold storage 330 may store a programmed threshold and subsequently protect the storage of the programmed threshold. For example, threshold storage 330 may include a fuse that can be blown to prevent a programmed threshold from being changed (e.g., the threshold storage 330 may be OTP memory). In another example, threshold storage 330 may not adjust the programmed threshold until receiving a known sequence of commands from host device 305. That is, host device 305 may transmit the sequence of commands to memory device 310. Memory device 310 (e.g., via controller 320 or excess row access detection circuit 335) may then determine to store an updated programmed threshold at threshold storage 330 based on receiving the sequence of commands.

Excess row access detection circuit 335 may determine which of the preconfigured or the programmed threshold to use based on a minimum threshold (e.g., selecting a minimum value of the preconfigured or programmed threshold). In some other cases, excess row access detection circuit 335 may determine which of the preconfigured or the programmed threshold to use based on a flag register. The flag register may indicate to excess row access detection circuit 335 to use a programmed threshold. For example, if the flag register is storing a logic '0', the excess row access detection circuit 335 may use the preconfigured threshold. Alternatively, if the flag register is storing a logic '1', the excess row access detection circuit 335 may use the programmed threshold. In some cases, host device 305 may set the flag register. In some cases, one or more (e.g., some or all) functions ascribed herein to excess row access detection circuit 335 may be integrated into controller 320.

Excess row access detection circuit 335 may include circuit components configured to determine a row access metric. The excess row access detection circuit 335 may be or include a counter, a timer, or the like. The row access metric may indicate a number of related accesses (e.g., a number or pattern of accesses to the same or similar rows, banks, etc.). Excess row access detection circuit 335 may receive an indication of the accesses (e.g., access commands received from host device 305) from memory interface 315 or controller 320. That is, during an access mode, controller 320 may execute access commands received from host device 305 on memory array 325. Controller 320 may further provide an indication of the accesses to excess row access detection circuit 335. Based on the accesses, excess row access detection circuit 335 may determine a number of related accesses and compare the row access metric with a threshold (e.g., the preconfigured or programmed threshold) from threshold storage 330. If excess row access detection circuit 335 determines that the row access metric satisfies the threshold, excess row access detection circuit 335 may provide an indication to controller 320. The indication may include information indicating for which row or rows (e.g., group of rows, bank) the row access metric satisfies the threshold. Upon receiving the indication of the row access metric satisfying the threshold, controller 320 may transition one or more portions of memory array 325 from an access mode to a safe mode. The safe mode may prevent additional row accesses to memory array 325 that would increase the probability of bits of memory array 325 changing memory states (e.g., due to a row hammer access pattern). A safe mode, as used herein, includes a restriction of access to at least one row of memory array 325.

In addition to entering the safe mode, or alternatively, controller 320 may transmit an indication to host device 305 that the row access metric satisfies the threshold. In some cases, the indication may include information related to the row or pattern of rows for which the access metric satisfies the threshold (e.g., the triggering condition). Additionally or alternatively, the information related to the row or pattern of rows for the triggering condition may be stored (e.g., in the controller 320 or the excess row access detection circuit 335) for access by the host device 305. Thus, upon receiving the indication, the host device 305 may read one or more registers of the memory device that include the information related to the row or pattern of rows for which the access metric satisfies the threshold.

The safe mode may include controller 320 blocking access commands directed to memory array 325. In one example, the safe mode may include controller 320 blocking access commands to each of the banks for memory array 325. In another example, the safe mode may include controller 320 blocking access commands to a single bank (e.g., a victim bank of the access commands). Here, controller 320 may block access commands to the single bank while the remaining banks within memory array 325 may continue to operate in an access mode (e.g., controller 320 may propagate access commands to the remaining banks). During the safe mode, controller 320 may initiate a refresh operation for the bank or banks associated with the safe mode.

Controller 320 may maintain the safe mode for a predetermined period of time (e.g., time period or number of clocks), or until receiving a command from the host device 305 to return to the access mode. A reset procedure may transition memory array 325 from the safe mode to the access mode. The command to reset to the access mode may include a single command, or a sequence of commands that may be known by host device 305 and by controller 320. The sequence may act as a guard key. Here, host device 305 may transmit the sequence of commands (e.g., guard key) to memory device 310. The controller 320 may recognize the sequence of commands and transition the one or more banks or rows from the safe mode to the access mode. Because of the transition into safe mode and the time for receiving the sequence to re-enter the access mode, any victim cells of the memory array 325 may be fully refreshed upon resuming the access mode. Thus, any attempted row hammer may result in looping into and out of safe mode, but the states of the memory cells may not be compromised.

In addition to entering the safe mode, or in cases where the safe mode is not entered, the controller 320 may perform other mitigating actions for the detected row hammer condition. For example, where the controller 320 does not place an entire bank or multiple banks into the self-refresh mode, the controller 320 may perform additional background refresh operations on the victim rows (e.g., those rows that are likely to be affected by the detected row hammering).

Figure 4:
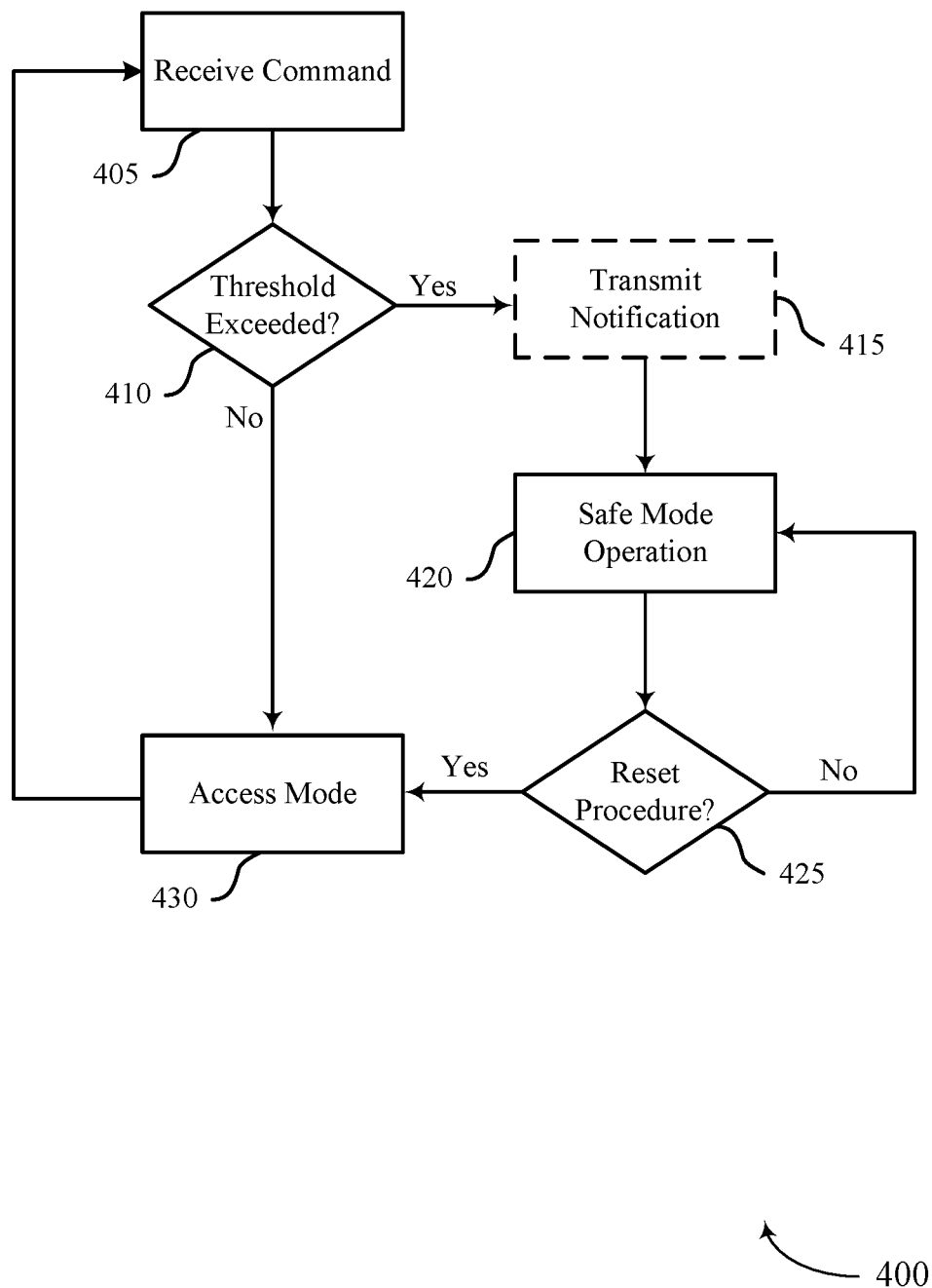
FIGS. 4 through 6 show process flows that support row hammer protection for a memory device as disclosed herein.

FIG. 4 shows an example diagram of a process flow 400 that supports techniques for row hammer protection for a memory device. The features of process flow 400 may be implemented or performed by a memory device (e.g., the memory device 110, the memory dice 160, the memory die 200, or the memory device 310 described with reference to FIGS. 1 through 3) or a component of a memory device such as the device memory controller 155, the local memory controllers 165, the local memory controller 260, the controller 320, or the excess row access detection circuit 335 as described with reference to FIGS. 1 through 3.

At block 405, circuitry associated with a memory device may receive a command from a host device. The command may be a row access command for a memory array. The circuitry may be operating according to an access mode, which includes the circuitry executing commands from the host device on the memory array. The circuitry may correspond, for example, to portions of memory interface 315, controller 320, excess row access detection circuit 335, or threshold storage 330 of FIG. 3.

At block 410, the circuitry may determine whether a threshold associated with access commands for the memory array have been exceeded. The threshold may define a number of related accesses (e.g., part of a pattern) that, when exceeded, may risk data corruption from row hammering. In some cases, the row access command received at block 405 may be associated with one or more rows undergoing a plurality of related accesses. The circuitry may generate a metric of the related accesses and compare the metric to the threshold. When the circuitry determines that the metric of the memory access satisfies the threshold, the circuitry may proceed to block 415. Alternatively, when the circuitry determines that the metric does not satisfy the threshold, the circuitry may continue to operate in an access mode—e.g., at block 430.

At block 415, the circuitry may optionally transmit a notification to the host device indicating that the threshold has been satisfied.

At block 420, the circuitry may transition the memory array from the access mode to a safe mode operation. The safe mode may prevent additional row accesses to the memory array that would increase the probability of bits of the memory array changing memory states (e.g., due to a row hammer access pattern). The safe mode may further include the circuit completing a refresh operation for the portion of the memory array operating within the safe mode. In some cases, the circuitry may determine to transition to one safe mode operation from a plurality of different safe mode operations. Each different safe mode operation may include at least a portion of the memory array being transitioned into a safe mode. For example, a first safe mode operation may include the circuit blocking access commands to a row or a group of rows. In a second safe mode operation, the circuitry may block commands to a full row address space or bank. In a third safe mode operation, the circuit may block commands to the full memory array. In some examples (e.g., in the first or second safe modes), portions within the memory array that are not operating within a safe mode may continue to operate normally (e.g., according to the access mode). That is, the circuitry may transition a portion of the memory array to a safe mode (e.g., thus blocking access commands to that portion) while executing access commands for the host device to the memory device that access other portions of the memory array.

At block 425, the controller may identify whether a reset procedure has been executed at the portion of the memory array that have been transitioned to a safe mode operation. A reset procedure may transition the memory array from the safe mode to the access mode. When the circuitry determines that the reset procedure has been executed, the circuitry may proceed to block 430, where the circuitry may transition the portion or portions of the memory array that had been operating in a safe mode into the access mode. Alternatively, when the circuitry determines that the reset procedure has not been executed, the controller may proceed to block 420 (e.g., the circuitry may continue to block access commands to the portion or portions of the memory array that are operating within a safe mode).

Figure 5:
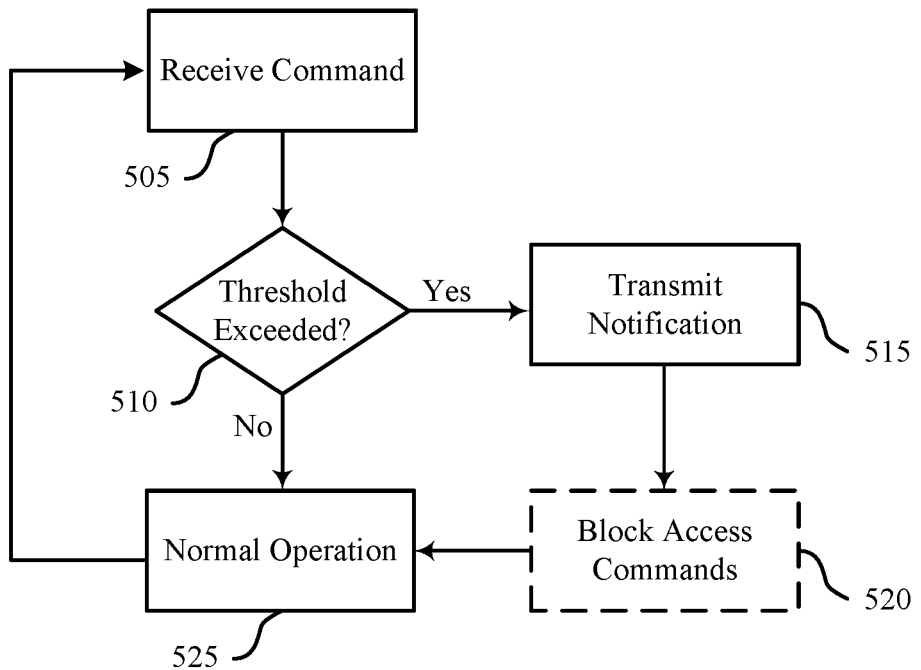

FIG. 5 shows an example diagram of a process flow 500 that supports techniques for row hammer protection for a memory device. The features of process flow 500 may be implemented or performed by a memory device (e.g., the memory device 110, the memory dice 160, the memory die 200, or the memory device 310 described with reference to FIGS. 1 through 3) or a component of a memory device such as the device memory controller 155, the local memory controllers 165, the local memory controller 260, the controller 320, or the excess row access detection circuit 335 as described with reference to FIGS. 1 through 3.

At block 505, circuitry associated with a memory device may receive a command from a host device. The command may be a row access command for a memory array. The circuitry may be operating according to an access mode, which includes the circuitry executing commands from the host device on the memory array. The circuitry may correspond, for example, to portions of memory interface 315, controller 320, excess row access detection circuit 335, or threshold storage 330 of FIG. 3.

At block 510, the circuitry may determine whether a threshold associated with access commands for the memory array have been satisfied. The threshold may define a number of related accesses (e.g., part of a pattern) that, when exceeded, may risk data corruption from row hammering. In some cases, the row access command received at block 505 may be associated with a row undergoing a plurality of related accesses. The circuitry may generate a metric of the related accesses and compare the metric to the threshold. When the circuitry determines that the threshold of the memory device has been satisfied, the circuitry may proceed to block 515. Alternatively, when the circuitry determines that the threshold of the memory device is not satisfied, the circuitry may continue to operate in an access mode—e.g., at block 525.

At block 515, the circuitry may transmit a notification to the host device indicating that the threshold has been satisfied. Transmission of the notification may include, for example, changing a state on a pin coupled with the host device (e.g., multifunction or dedicated pin). In some other examples, the notification may be transmitted via a sideband port communication (e.g., via an Inter-Integrated Circuit (I2C) bus or a Joint Test Action Group (JTAG) bus). The notification may be transmitted via a bit or bits within a data packet. Additionally or alternatively, the notification may be stored in a bit or bits of a register and the host may poll the circuitry to determine a value stored in the register (e.g., via pins or the sideband port communication). The host device may take any number of responsive actions based on the notification. For example, in some cases, the host device may receive the notification and may block commands (e.g., not send commands to the memory device) that may correspond to the portion or portions of the memory array indicated by the satisfied threshold, may allow the memory device to continue with normal operation (e.g., may determine that the access resulting in the notification are legitimate or otherwise valid, or that continued operation of the memory device is mission critical), or may block one or are more applications from issuing subsequent access commands to the memory device. Additionally or alternatively, the circuitry may continue to block 520.

At block 520, the circuitry may optionally block access commands corresponding to a portion of the memory array. The controller may block the access commands for a predetermined amount of time prior to proceeding to block 525. That is, the controller may transition a portion of the memory array into a safe mode. The controller may, in some cases, allow access commands from the host device to portions of the memory array not operating in the safe mode. That is, the circuitry may operate a portion of the memory array according to a safe mode while operating some other portion of the memory array according to an access mode concurrently.

At block 525, the circuitry may transition the full memory array to the access mode of operation. That is, the controller may resume executing access commands (e.g., all access commands) from the host device to the memory array.

Figure 6:
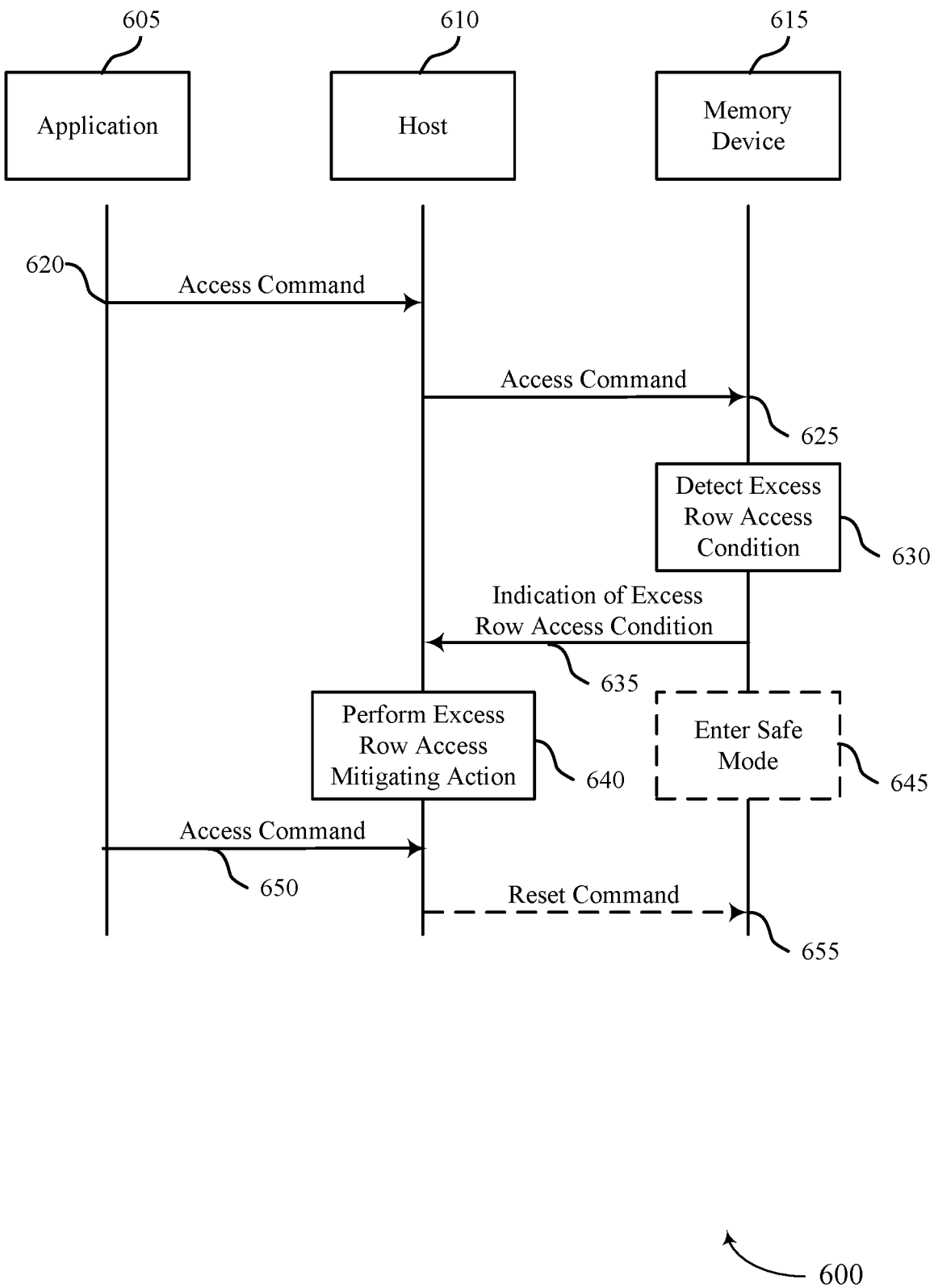

FIG. 6 illustrates an example of a process flow 600 that supports techniques for row hammer protection for a memory device. In some examples, process flow 600 may implement aspects of the systems 100 and 300, memory die 200, and process flows 400 and 500. The process flow 600 may include operations performed by an application 605, which may be an example of software running on a processor. The host 610 may be an example of the host device described with reference to FIGS. 1, 3, 4, and 5. The application 605 may be running on a processor that is separate from the host 610. Alternatively, the application 605 may be running on a processor that is a component of the host 610. The memory device 615 may be an example of a memory device (e.g., the memory device 110, the memory dice 160, the memory die 200, or the memory device 310) as described with reference to FIGS. 1 through 5.

The application 605 may issue an access command 620, which may be a logical or virtual memory access command. The host 610 may execute access command 620, which may result in host 610 performing a memory function on memory device 615. Host 610 may transmit access command 625 to memory device 615. Memory device 615 may be operating according to an access mode, which may include executing all access commands received from host 610.

At 630, the memory device 615 may detect an excess row access (e.g., row hammer) condition. In some cases, the memory device 615 may detect the excess row access condition by determining that a metric (e.g., number or pattern) associated with access commands including access command 625 satisfies a threshold associated with access commands for the memory device 615.

The memory device 615 may transmit an indication 635 of the detected excess row access condition to the host 610. The indication 635 may include an indication of a row, a group of rows, or a bank associated with the detected excess row access condition. At 645, the memory device 615 may optionally enter a safe mode. The safe mode may restrict access to at least one row (e.g., a row, a group of rows, a bank, multiple banks) of a memory array of memory device 615.

At 640, the host 610 may perform a mitigation action for the excess row access condition detected by the memory device 615. In some cases, the mitigation action may include causing the memory device 615 to go into a safe mode (e.g., self-refresh mode). Alternatively, the host 610 may prevent commands executed by the application 605 from resulting in memory access commands to at least a portion of the memory device 615. That is, the host 610 may not transmit access commands to the memory device that access the rows, group of rows, bank, or banks associated with the detected excess row access condition. For example, host 610 may process an access command 650 that calls for an access to the memory device 615, but not perform the access command to memory device 615. In some other cases, the host 610 may account for the excess row access condition by switching, e.g., temporarily, to a redundant memory device. That is, any commands executed based on the application 605 may be transmitted to and/or performed by a memory device different than memory device 615. In some other cases, the host 610 may mitigate the excess row access condition by shutting down the application 605 (e.g., halting the execution of commands from application 605). The shutdown may be temporary (e.g., the host 610 may shut down the application 605 for a predetermined amount of time in reaction to the excess row access condition indication). Additionally or alternatively, the shutdown may occur based on a time for a refresh operation (e.g., the host 610 may shut down the application 605 for the amount of time necessary to refresh the bank or banks within the memory device 615 associated with the detected excess row access condition).

The host 610 may, optionally, transmit a reset command 655 to the memory device 615 to transition the memory device 615 from the safe mode to the access mode. That is, in the event that the memory device 615 has entered a safe mode, the host 610 may transmit the reset command 655 to the memory device 615. For example, a controller associated with the memory device 615 may not execute commands received from the host 610 if the commands are associated with the bank or banks corresponding to the detected excess row access condition. At 655, the host 610 may transmit the reset command, triggering the memory device 615 to transition from the safe mode to the access mode. The command to reset to the access mode may include a single command, or a sequence of commands that may be known by host 610 and by memory device 615. The memory device 615 may recognize the sequence of commands and transition from the safe mode to the access mode (not shown).

Figure 7:
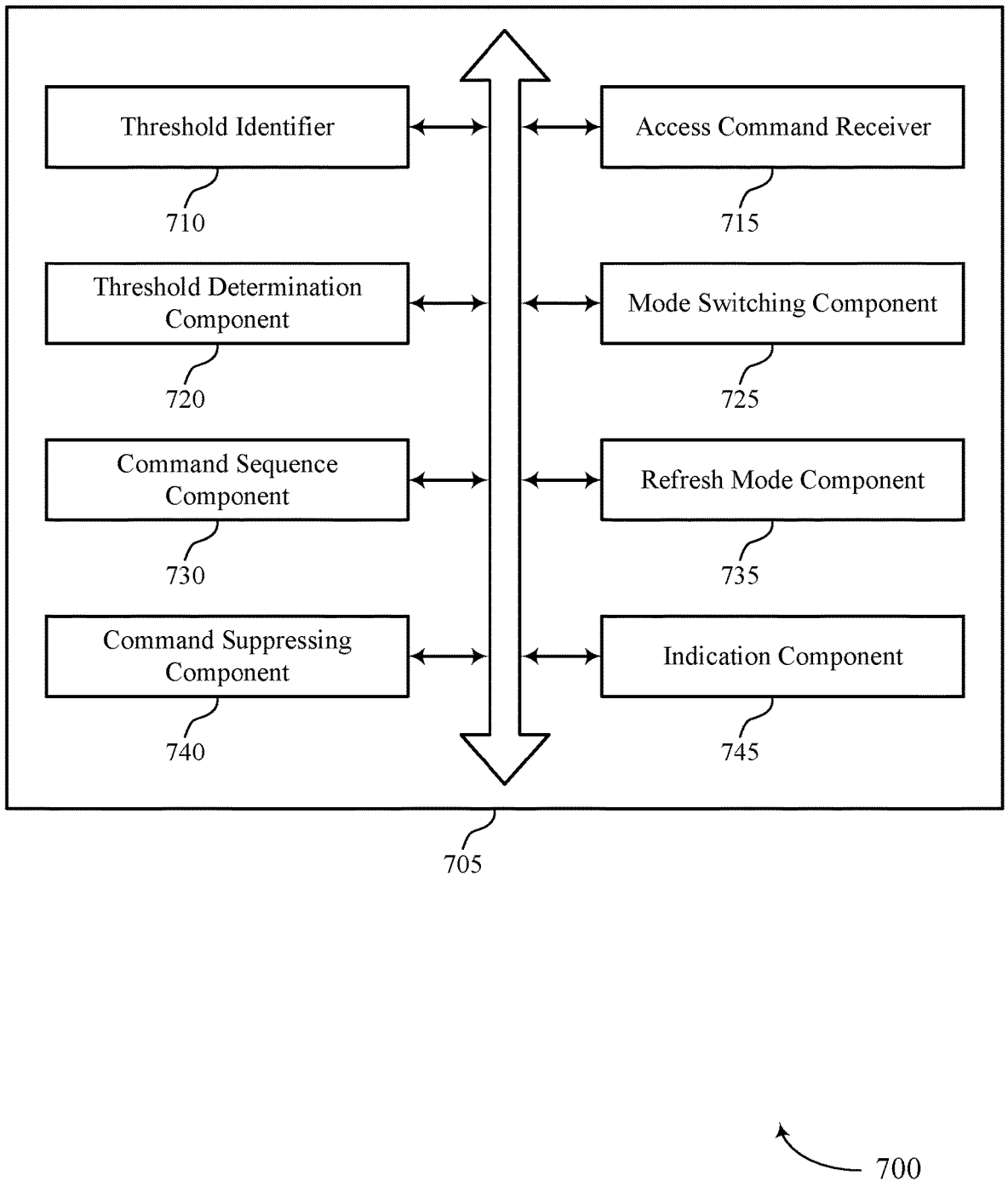
FIG. 7 shows a block diagram of circuitry that supports row hammer protection for a memory device as disclosed herein.

FIG. 7 shows a block diagram 700 of circuitry 705 that supports row hammer protection for a memory device as disclosed herein. The circuitry 705 may be an example of aspects of a controller, a memory interface, an excess row access detection circuit, or threshold storage as described herein. The circuitry 705 may include a threshold identifier 710, an access command receiver 715, a threshold determination component 720, a mode switching component 725, a command sequence component 730, a refresh mode component 735, a command suppressing component 740, and an indication component 745. Each of these modules may communicate, directly or indirectly, with one another (e.g., via one or more buses).

The threshold identifier 710 may identify a threshold of row accesses for a memory array, the memory array including a set of rows. In some examples, the threshold identifier 710 may identify a threshold of row accesses for a memory array, the memory array including a set of rows. In some examples, the threshold identifier 710 may receive, from the host, signaling that indicates a second threshold of row accesses, where identifying the threshold is based on the second threshold. In some examples, the threshold identifier

710 may determine the threshold by comparing the second threshold and a third threshold that is stored in non-volatile memory (e.g., preconfigured threshold). In some examples, the threshold identifier 710 may determine the threshold based on a minimum of a second threshold received from the host and the third threshold stored in non-volatile memory.

The access command receiver 715 may receive, in a first mode of operation, row access commands for the memory array from a host. For example, the first mode of operation may be an access mode as described herein. In some examples, the access command receiver 715 may receive a set of row access commands for the memory array from a host. In some examples, the access command receiver 715 may receive a row access command for a second row of the memory array. In some examples, the access command receiver 715 may receive, from the host, a command sequence indicating a mode of operation based on transmitting the indication to the host.

The threshold determination component 720 may determine, for a row of the set of rows, that a metric of the row access commands satisfies the threshold. In some examples, the threshold determination component 720 may determine, for a row of the set of rows, that a pattern or metric of the set of row access commands satisfies the threshold.

The mode switching component 725 may switch the memory array from the first mode of operation to a second mode of operation based on determining that the metric of the row access commands satisfies the threshold, where the second mode of operation is associated with restricting access to at least one row of the set of rows of the memory array. The second mode of operation may be, for example a safe mode as described herein.

In some examples, the mode switching component 725 may switch the memory array from the second mode to the first mode based on receiving the command sequence. In some examples, the mode switching component 725 may start a timer upon switching the memory array from the first mode to the second mode. In some examples, the mode switching component 725 may switch the memory array from the second mode to the first mode based on expiration of the timer. In some examples, the mode switching component 725 may select the second mode of operation from a set of modes of operation according to a configured setting. In some examples, the mode switching component 725 may operate a second bank of the memory array in the first mode.

The command sequence component 730 may receive, from the host while operating in the second mode, a command sequence for resetting the memory array to the first mode.

The refresh mode component 735 may operate a first bank of the memory array associated with the row in a self-refresh mode. In some examples, the refresh mode component 735 may operate a set of banks of the memory array in a self-refresh mode.

The command suppressing component 740 may suppress row access commands to a bank of the memory array associated with the row. In some examples, the command suppressing component 740 may suppress access for the second row of the memory array based on receiving the row access command for the second row. In some cases, the second row and the row are a same row.

The indication component 745 may transmit an indication to the host based on determining that the pattern of the set of row access commands satisfies the threshold.

Figure 8:
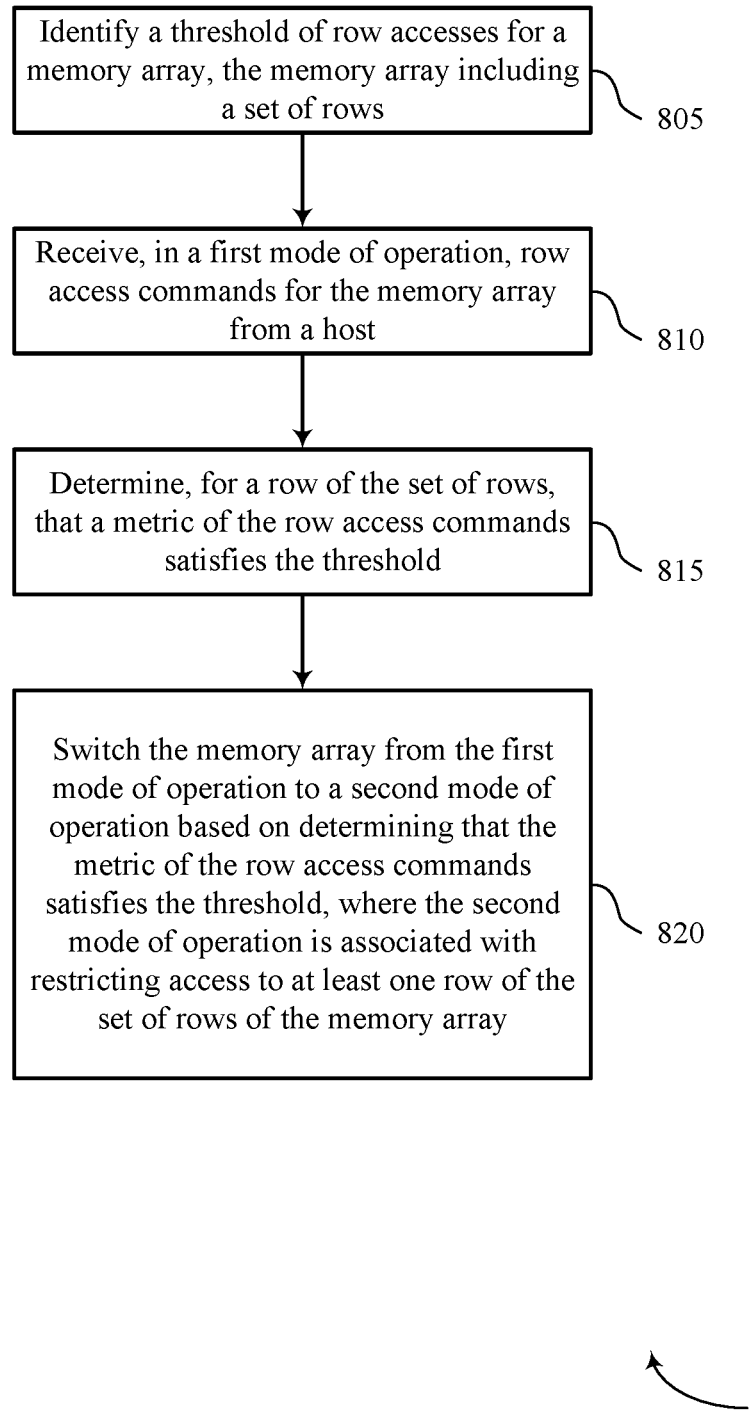
FIGS. 8 and 9 show flowcharts illustrating a method or methods that support row hammer protection for a memory device as disclosed herein.

FIG. 8 shows a flowchart illustrating a method 800 that supports row hammer protection for a memory device as disclosed herein. The operations of method 800 may be implemented by a device or its components as described herein. For example, the operations of method 800 may be performed by circuitry as described herein. In some examples, a device may execute a set of instructions to control the functional elements of the device to perform the functions described below. Additionally or alternatively, a device may perform aspects of the functions described below using special-purpose hardware.

At 805, the device may identify a threshold of row accesses for a memory array, the memory array including a set of rows. The operations of 805 may be performed according to the methods described herein. In some examples, aspects of the operations of 805 may be performed by a threshold identifier as described with reference to FIG. 7.

At 810, the device may receive, in a first mode of operation, row access commands for the memory array from a host. For example, the first mode of operation may be an access mode as described herein. The operations of 810 may be performed according to the methods described herein. In some examples, aspects of the operations of 810 may be performed by an access command receiver as described with reference to FIG. 7.

At 815, the device may determine, for a row of the set of rows, that a metric of the row access commands satisfies the threshold. The operations of 815 may be performed according to the methods described herein. In some examples, aspects of the operations of 815 may be performed by a threshold determination component as described with reference to FIG. 7.

At 820, the device may switch the memory array from the first mode of operation to a second mode of operation based on determining that the metric of the row access commands satisfies the threshold, where the second mode of operation is associated with restricting access to at least one row of the set of rows of the memory array. The second mode of operation may be, for example a safe mode as described herein. The operations of 820 may be performed according to the methods described herein. In some examples, aspects of the operations of 820 may be performed by a mode switching component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for identifying a threshold of row accesses for a memory array, the memory array comprising a plurality of rows, receiving, in a first mode of operation, row access commands for the memory array from a host, determining, for a row of the plurality of rows, that a metric of the row access commands satisfies the threshold, and switching the memory array from the first mode of operation to a second mode of operation based at least in part on determining that the metric of the row access commands satisfies the threshold, wherein the second mode of operation is associated with restricting access to at least one row of the plurality of rows of the memory array.

Some examples of the methods and apparatuses described herein may further include processes, features, means, or instructions for receiving, from the host while operating in the second mode, a command sequence for resetting the memory array to the first mode and switching the memory array from the second mode to the first mode based on receiving the command sequence.

In some examples of the methods and apparatuses described herein may further include processes, features, means, or instructions for starting a timer upon switching the memory array from the first mode to the second mode and switching the memory array from the second mode to the first mode based on expiration of the timer.

Some examples of the methods and apparatuses described herein may further include processes, features, means, or instructions for receiving, from the host, signaling that indicates a second threshold of row accesses, where identifying the threshold may be based on the second threshold.

In some examples of the methods and apparatuses described herein, identifying the threshold of row accesses may include operations, features, means, or instructions for determining the threshold by comparing the second threshold and a third threshold that may be stored in non-volatile memory.

Some examples of the methods and apparatuses described herein may further include processes, features, means, or instructions for selecting the second mode of operation from a set of modes of operation according to a configured setting.

Some examples of the methods and apparatuses described herein may further include processes, features, means, or instructions for, while operating the memory array in the second mode, operating a first bank of the memory array associated with the row in a self-refresh mode and operating a second bank of the memory array in the first mode.

Some examples of the methods and apparatuses described herein may further include processes, features, means, or instructions for, while operating the memory array in the second mode, operating a set of banks of the memory array in a self-refresh mode.

Some examples of the methods and apparatuses described herein may further include processes, features, means, or instructions for, while operating the memory array in the second mode, suppressing row access commands to a bank of the memory array associated with the row.

Some examples of the methods and apparatuses described herein may further include processes, features, means, or instructions for, while operating the memory array in the second mode, receiving a row access command for a second row of the memory array and suppressing access for the second row of the memory array based on receiving the row access command for the second row.

In some examples of the methods and apparatuses described herein, and non-transitory computer-readable medium described herein, the second row and the row may be a same row.

Figure 9:
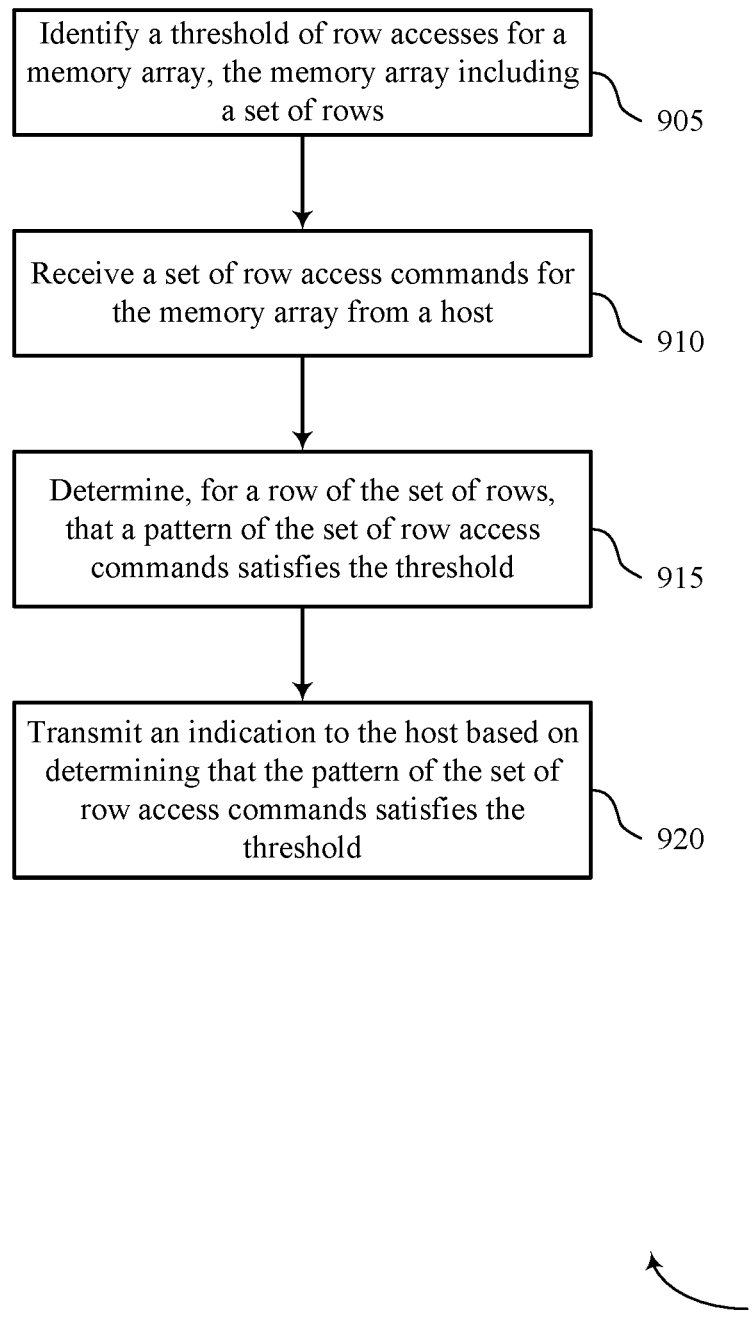

FIG. 9 shows a flowchart illustrating a method 900 that supports row hammer protection for a memory device as disclosed herein. The operations of method 900 may be implemented by a device or its components as described herein. For example, the operations of method 900 may be performed by circuitry as described herein. In some examples, a device may execute a set of instructions to control the functional elements of the device to perform the functions described below. Additionally or alternatively, a device may perform aspects of the functions described below using special-purpose hardware.

At 905, the device may identify a threshold of row accesses for a memory array, the memory array including a set of rows. The operations of 905 may be performed according to the methods described herein. In some examples, aspects of the operations of 905 may be performed by a threshold identifier as described with reference to FIG. 7.

At 910, the device may receive a set of row access commands for the memory array from a host. The operations of 910 may be performed according to the methods described herein. In some examples, aspects of the operations of 910 may be performed by an access command receiver as described with reference to FIG. 7.

At 915, the device may determine, for a row of the set of rows, that a pattern or metric of the set of row access commands satisfies the threshold. The operations of 915 may be performed according to the methods described herein. In some examples, aspects of the operations of 915 may be performed by a threshold determination component as described with reference to FIG. 7.

At 920, the device may transmit an indication to the host based on determining that the pattern of the set of row access commands satisfies the threshold. The operations of 920 may be performed according to the methods described herein. In some examples, aspects of the operations of 920 may be performed by an indication component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for identifying a threshold of row accesses for a memory array, the memory array including a set of rows, receiving a set of row access commands for the memory array from a host, determining, for a row of the set of rows, that a pattern of the set of row access commands satisfies the threshold, and transmitting an indication to the host based on determining that the pattern of the set of row access commands satisfies the threshold.

Some examples of the methods and apparatuses described herein may further include processes, features, means, or instructions for determining the threshold based on a minimum of a second threshold received from the host and a third threshold stored in non-volatile memory.

Some examples of the methods and apparatuses described herein may further include processes, features, means, or instructions for receiving, from the host, a command sequence indicating a mode of operation based on transmitting the indication to the host.

It should be noted that the methods described herein describe possible implementations, and that the operations and the steps may be rearranged or otherwise modified and that other implementations are possible. Furthermore, aspects from two or more of the methods may be combined.

In some examples, an apparatus or device may perform aspects of the functions described herein using general- or special-purpose hardware. The apparatus or device may include a memory array having a set of rows, a memory interface coupled with the memory array and a host, the memory interface operable to receive row access commands from the host, and circuitry coupled with the memory array and the memory interface. The circuitry may be operable to execute, in a first mode of operation, the row access commands on the memory array, determine, for a row of the set of rows, that a metric of the row access commands satisfy the threshold, and switch the memory array from the first mode of operation to a second mode of operation based on determining that the metric of the row access commands satisfies the threshold, where the second mode of operation is associated with restricting access to at least one row of the set of rows of the memory array.

In some examples, the circuitry may be operable to receive from the host via the memory interface while operating the memory array in the second mode, a command sequence for resetting the memory array to the first mode and switch the memory array to the first mode based on receiving the command sequence.

In some examples, the circuitry may be operable to start a timer upon switching the memory array from the first mode to the second mode and switch the memory array from the second mode to the first mode based on expiration of the timer.

In some examples, the circuitry may be operable to identify the threshold based on comparing a second threshold received from the host with a third threshold that may be stored in non-volatile memory.

In some examples, the circuitry may be operable to select the second mode of operation from a set of modes of operation according to a configured setting.

In some examples, the circuitry may be operable to operate a first bank of the memory array associated with the row in a self-refresh mode and operate a second bank of the memory array in a mode different than the self-refresh mode.

In some examples, the circuitry may be operable to operate a set of banks of the memory array in a self-refresh mode.

In some examples, the circuitry may be operable to determine whether to execute the row access commands for at least some of a set of banks of the memory array.

In some examples, the circuitry may be operable to receive a row access command for a second row of the memory array and suppress access for the second row of the memory array after receiving the row access command. In some examples, the second row and the row may be a same row.

In some examples, the apparatus or device may include a memory array having a set of rows, a memory interface coupled with the memory array and a host, the memory interface operable to receive row access commands from the host, and circuitry coupled with the memory array and the memory interface. The circuitry may be operable to perform the row access commands on the memory array, determine, for a row of the set of rows, that performing the row access commands satisfies the threshold, and transmit, to the host via the memory interface, an indication that performing the row access commands satisfies the threshold.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   determining a threshold of row accesses for a memory array, the memory array comprising a plurality of rows;
   receiving, in a first mode of operation, row access commands for the memory array from a host;
   determining, for a row of the plurality of rows, that a metric of the row access commands satisfies the threshold;
   switching the memory array from the first mode of operation to a second mode of operation based at least in part on determining that the metric of the row access commands satisfies the threshold, wherein the second mode of operation is associated with restricting access to at least one row of the plurality of rows of the memory array; and
   switching the memory array from the second mode of operation to the first mode of operation based at least in part on an expiration of a timer that is associated with an amount of time spent in the second mode of operation.

2. The method of claim 1, further comprising:
   starting the timer upon switching the memory array from the first mode of operation to the second mode of operation, wherein the expiration of the timer is based at least in part on starting the timer.

3. The method of claim 1, wherein switching the memory array from the second mode of operation to the first mode of operation is based at least in part on a predetermined time period for the second mode of operation or a predetermined quantity of clock cycles for the second mode of operation.

4. The method of claim 1, further comprising:
   transmitting an indication to the host based at least in part on determining that the metric of the row access commands satisfies the threshold.

5. The method of claim 4, wherein the indication indicates the row having the metric of the row access commands that satisfies the threshold.

6. The method of claim 1, wherein identifying the threshold of row accesses for the memory array comprises:
 identifying a first threshold of row accesses for a first quantity of the plurality of rows of the memory array; and
 identifying a second threshold of row accesses for a second quantity of the plurality of rows of the memory array, wherein the second threshold of row accesses is different from the first threshold of row accesses.

7. The method of claim 1, further comprising:
 selecting the second mode of operation from a plurality of modes of operation according to a configured setting.

8. The method of claim 1, further comprising, while operating the memory array in the second mode of operation:
 operating a first bank of the memory array associated with the row in a self-refresh mode; and
 operating a second bank of the memory array in the first mode of operation.

9. The method of claim 1, further comprising, while operating the memory array in the second mode of operation:
 operating a plurality of banks of the memory array in a self-refresh mode.

10. A device, comprising:
 a memory array having a plurality of rows;
 a memory interface coupled with the memory array and a host, the memory interface operable to receive row access commands from the host; and
 circuitry coupled with the memory array and the memory interface, the circuitry operable to:
  identify a threshold of row accesses for the memory array;
  execute, in a first mode of operation, the row access commands on the memory array;
  determine, for a row of the plurality of rows, that a metric of the row access commands satisfy the threshold;
  switch the memory array from the first mode of operation to a second mode of operation based at least in part on determining that the metric of the row access commands satisfies the threshold, wherein the second mode of operation is associated with restricting access to at least one row of the plurality of rows of the memory array; and
  switch the memory array from the second mode of operation to the first mode of operation based at least in part on an amount of time spent in the second mode of operation.

11. The device of claim 10, further comprising:
 a timer coupled with the circuitry, wherein the circuitry is further operable to:
  start the timer upon switching the memory array from the first mode of operation to the second mode of operation; and
  switch the memory array from the second mode of operation to the first mode of operation based at least in part on an expiration of the timer.

12. The device of claim 10, wherein switching the memory array from the second mode of operation to the first mode of operation is based at least in part on a predetermined time period for the second mode of operation or a predetermined quantity of clock cycles for the second mode of operation.

13. The device of claim 10, the circuitry further operable to:
 transmit, based at least in part on the determining, an indication to the host via the memory interface that the metric of the row access commands satisfies the threshold.

14. The device of claim 13, wherein the indication indicates the row having the metric of the row access commands that satisfies the threshold.

15. The device of claim 10, wherein identifying the threshold of row accesses for the memory array comprises:
 identifying a first threshold of row accesses for a first quantity of the plurality of rows of the memory array; and
 identifying a second threshold of row accesses for a second quantity of the plurality of rows of the memory array, wherein the second threshold of row accesses is different from the first threshold of row accesses.

16. The device of claim 10, the circuitry further operable to:
 select the second mode of operation from a plurality of modes of operation according to a configured setting.

17. The device of claim 10, the circuitry further operable to, while operating the memory array in the second mode of operation:
 operate a first bank of the memory array associated with the row in a self-refresh mode; and
 operate a second bank of the memory array in the first mode of operation.

18. The device of claim 10, the circuitry further operable to, while operating the memory array in the second mode of operation:
 operating a plurality of banks of the memory array in a self-refresh mode.

19. A device, comprising:
 a memory array having a plurality of rows;
 a memory interface coupled with the memory array and a host, the memory interface operable to receive row access commands from the host;
 a detection circuit coupled with the memory interface and operable to:
  identify a threshold of row accesses for the memory array; and
  determine, for a row of the plurality of rows, that a metric of the row access commands satisfy the threshold; and
 a controller coupled with the detection circuit, the memory interface, and the memory array, the controller operable to:
  execute, in a first mode of operation, the row access commands on the memory array;
  switch the memory array from the first mode of operation to a second mode of operation based at least in part on determining that the metric of the row access commands satisfies the threshold, wherein the second mode of operation is associated with restricting access to at least one row of the plurality of rows of the memory array; and
  switch the memory array from the second mode of operation to the first mode of operation based at least in part on an expiration of a timer that is associated with an amount of time spent in the second mode of operation.

20. The device of claim 19, the controller further operable to:
    start the timer upon switching the memory array from the first mode of operation to the second mode of operation, wherein the expiration of the timer is based at least in part on starting the timer.

\* \* \* \* \*